United States Patent
Sakakibara et al.

(10) Patent No.: US 11,319,458 B2
(45) Date of Patent: May 3, 2022

(54) METHOD FOR FABRICATING SEMICONDUCTOR DEVICE CHIPS AND PROTECTIVE COMPOSITION

(71) Applicants: GOO CHEMICAL CO., LTD., Kyoto (JP); Panasonic Intellectual Property Management Co., Ltd., Osaka (JP)

(72) Inventors: Teru Sakakibara, Kyoto (JP); Shinya Komabiki, Kyoto (JP); Koji Maeda, Kyoto (JP); Hidehiko Karasaki, Hyogo (JP)

(73) Assignees: GOO CHEMICAL CO., LTD., Kyoto (JP); PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/280,185

(22) PCT Filed: Mar. 9, 2020

(86) PCT No.: PCT/JP2020/009972
§ 371 (c)(1),
(2) Date: Mar. 26, 2021

(87) PCT Pub. No.: WO2021/181447
PCT Pub. Date: Sep. 16, 2021

(65) Prior Publication Data
US 2021/0324226 A1 Oct. 21, 2021

(51) Int. Cl.
*H01L 21/78* (2006.01)
*C09D 167/02* (2006.01)
(Continued)

(52) U.S. Cl.
CPC ......... *C09D 167/02* (2013.01); *C08G 63/183* (2013.01); *C08G 63/189* (2013.01);
(Continued)

(58) Field of Classification Search
CPC ............. C09D 167/02; H01L 21/78; H01L 21/6835; H01L 2221/68381; H01L 2221/68327;
(Continued)

(56) References Cited

U.S. PATENT DOCUMENTS 8,835,283 B2 * 9/2014 Hua .................... H01L 29/0657
438/465
2006/0105544 A1 5/2006 Takanashi et al.
(Continued)

FOREIGN PATENT DOCUMENTS

| CN | 1800258 A | 7/2006 |
|---|---|---|
| CN | 105829104 A | 8/2016 |

(Continued)

OTHER PUBLICATIONS

Office Action in JP Application No. 2021-217716, dated Apr. 27, 2021. 3pp.
(Continued)

*Primary Examiner* — Vu A Vu
(74) *Attorney, Agent, or Firm* — Hauptman Ham, LLP

(57) ABSTRACT

A protective composition contains a water-soluble polyester resin including a polyvalent carboxylic acid residue and a polyvalent alcohol residue. The polyvalent carboxylic acid residue includes: a polyvalent carboxylic acid residue having a metal sulfonate group; and a naphthalene dicarboxylic acid residue. The proportion of the polyvalent carboxylic acid residue to the polyvalent carboxylic acid residue falls within the range from 25 mol % to 70 mol %. The proportion of the naphthalene dicarboxylic acid residue to the polyvalent carboxylic acid residue falls within the range from 30 mol % to 75 mol %.

20 Claims, 2 Drawing Sheets

(51) Int. Cl.
*C08G 63/183* (2006.01)
*C08G 63/189* (2006.01)
*H01L 21/683* (2006.01)

(52) U.S. Cl.
CPC .......... *H01L 21/6835* (2013.01); *H01L 21/78* (2013.01); *H01L 2221/6834* (2013.01); *H01L 2221/68327* (2013.01); *H01L 2221/68381* (2013.01)

(58) Field of Classification Search
CPC .......... H01L 2221/6834; C08G 63/189; C08G 63/183
USPC ........................................................ 438/465
See application file for complete search history.

(56) References Cited

U.S. PATENT DOCUMENTS

| | | | |
|---|---|---|---|
| 2010/0304551 A1 | 12/2010 | Takanashi et al. | |
| 2012/0322233 A1 | 12/2012 | Lei et al. | |
| 2014/0174659 A1 | 6/2014 | Lei et al. | |
| 2015/0037574 A1 | 2/2015 | Amano et al. | |
| 2016/0307851 A1 | 10/2016 | Ohura et al. | |
| 2020/0299538 A1* | 9/2020 | Watanabe | D21H 19/62 |

FOREIGN PATENT DOCUMENTS

| | | |
|---|---|---|
| CN | 106057738 A | 10/2016 |
| CN | 106715612 A | 5/2017 |
| CN | 107845607 A | 3/2018 |
| DE | 102005048860 A1 | 5/2006 |
| JP | 200382076 A | 3/2003 |
| JP | 2006140311 A | 6/2006 |
| JP | 2006152013 A | 6/2006 |
| JP | 2007317996 A | 12/2007 |
| JP | 201527766 A | 2/2015 |
| JP | 2016207737 A | 12/2016 |
| JP | 201742786 A | 3/2017 |
| KR | 1020060052590 A | 5/2006 |

OTHER PUBLICATIONS

International Search Report in PCT/JP2020/009972, dated May 26, 2020. 5pp.
Written Opinion in PCT/JP2020/009972, dated May 26, 2020. 6pp.
Notice of Allowance in KR Application No. 10-2021-7008281, dated Aug. 1, 2021. 4pp.
Office Action in TW Application No. 110107881, dated Dec. 6, 2021. 19pp.
Office Action in CN Application No. 202080005409.6, dated Jan. 27, 2022. 23pp.

* cited by examiner

METHOD FOR FABRICATING SEMICONDUCTOR DEVICE CHIPS AND PROTECTIVE COMPOSITION

CROSS-REFERENCE TO RELATED APPLICATION

This is a National Phase of International Application No. PCT/JP2020/009972, filed on Mar. 9, 2020.

TECHNICAL FIELD

The present disclosure generally relates to a method for fabricating semiconductor device chips and a protective composition, and more particularly relates to a method for fabricating semiconductor device chips including dividing, by dicing, a substrate into a plurality of semiconductor device chips and a protective composition for use in the method for fabricating semiconductor device chips.

BACKGROUND ART

Plasma dicing is one of techniques for fabricating a plurality of semiconductor device chips by dicing a substrate such as a silicon wafer after having formed an integrated circuit on the substrate. When plasma dicing is performed, a protective coating is sometimes used to protect the substrate.

For example, Patent Literature 1 discloses a resin agent for forming a protective coating. The resin agent includes a water-soluble resin and fine particles of a metal oxide, which are dispersed in the water-soluble resin and of which a cross section has an elongate shape with a major axis and a minor axis perpendicular to the major axis. Patent Literature 1 teaches forming a protective coating by applying the resin agent for forming a protective coating onto a wafer and irradiating the protective coating with a laser beam to subject the wafer to laser ablation. Patent Literature 1 also teaches that the protective coating may be used as an etch mask during plasma dicing. Patent Literature 1 teaches using polyvinyl alcohol, for example, as the water-soluble resin.

The technique disclosed in Patent Literature 1 allows the wafer and semiconductor device chips to be protected during the laser ablation and plasma dicing, and also allows the protective coating to be removed from the semiconductor device chips by washing the semiconductor device chips with water after the semiconductor device chips have been formed out of the wafer. However, the protective coating is exposed to a laser beam during the laser ablation and/or exposed to plasma during the plasma dicing, thus possibly altering the protective coating and causing a decline in its water solubility. In that case, it would take some time to sufficiently remove the protective coating from the semiconductor device chips by washing the semiconductor device chips with water, thus often causing a decline in manufacturing efficiency of the semiconductor device chips.

CITATION LIST

Patent Literature

Patent Literature 1: JP 2017-42786 A

SUMMARY OF INVENTION

The problem to be overcome by the present disclosure is to provide a method for fabricating semiconductor device chips that allows, when semiconductor device chips are fabricated by a method including irradiating a protective coating, which has been formed on a substrate, with at least one of a laser beam or plasma, the protective coating to be formed easily, to protect the substrate and the semiconductor device chips when irradiated with the laser beam and/or plasma, and to be removed easily, and also provide a protective composition for use in the method for fabricating semiconductor device chips.

A method for fabricating semiconductor device chips according to an aspect of the present disclosure is a method for fabricating semiconductor device chips by dividing a substrate into a plurality of semiconductor device chips. The method includes: forming a protective coating that covers the substrate by applying a protective composition onto the substrate; irradiating the protective coating with at least one of a laser beam or plasma; dividing the substrate into the plurality of semiconductor device chips by cutting off the substrate; and removing the protective coating that covers the semiconductor device chips from either the substrate or the semiconductor device chips by bringing the protective coating into contact with an aqueous cleaning fluid. The protective composition contains a water-soluble polyester resin (A) including a polyvalent carboxylic acid residue (a) and a polyvalent alcohol residue (b). The polyvalent carboxylic acid residue (a) includes: a polyvalent carboxylic acid residue (a1) having a metal sulfonate group; and a naphthalene dicarboxylic acid residue (a2). The proportion of the polyvalent carboxylic acid residue (a1) to the polyvalent carboxylic acid residue (a) falls within the range from 25 mol % to 70 mol %. The proportion of the naphthalene dicarboxylic acid residue (a2) to the polyvalent carboxylic acid residue (a) falls within the range from 30 mol % to 75 mol %.

A protective composition according to another aspect of the present disclosure is used to fabricate semiconductor device chips. A method for fabricating the semiconductor device chip is a method for fabricating semiconductor device chips by dividing a substrate into a plurality of semiconductor device chips. The method includes: forming a protective coating that covers the substrate by applying the protective composition onto the substrate; irradiating the protective coating with at least one of a laser beam or plasma; dividing the substrate into the plurality of semiconductor device chips by cutting off the substrate; and removing the protective coating from either the substrate or the semiconductor device chips by bringing the protective coating into contact with an aqueous cleaning fluid. The protective composition contains a water-soluble polyester resin (A) including a polyvalent carboxylic acid residue (a) and a polyvalent alcohol residue (b). The polyvalent carboxylic acid residue (a) includes: a polyvalent carboxylic acid residue (a1) having a metal sulfonate group; and a naphthalene dicarboxylic acid residue (a2). The proportion of the polyvalent carboxylic acid residue (a1) to the polyvalent carboxylic acid residue (a) falls within the range from 25 mol % to 70 mol %. The proportion of the naphthalene dicarboxylic acid residue (a2) to the polyvalent carboxylic acid residue (a) falls within the range from 30 mol % to 75 mol %.

DESCRIPTION OF EMBODIMENTS

Figure 1:
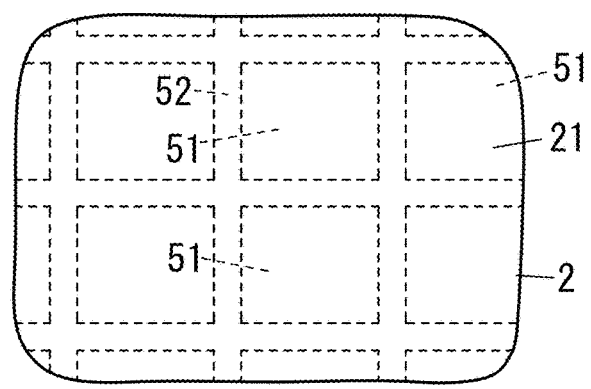
FIG. 1 is a plan view of a substrate according to an exemplary embodiment of the present disclosure.

An overview of a method for fabricating semiconductor device chips 1 according to the present disclosure will be described.

According to a method for fabricating semiconductor device chips 1, a substrate 2 is divided into a plurality of semiconductor device chips 1. According to this method, a protective coating 3 that covers the substrate 2 is formed by applying a protective composition onto the substrate 2. The protective coating 3 is irradiated with at least one of a laser beam or plasma. The substrate 2 is divided into the plurality of semiconductor device chips 1 by cutting off the substrate 2. The protective coating 3 is removed from either the substrate 2 or the semiconductor device chips 1 by bringing the protective coating 3 into contact with an aqueous cleaning fluid. The protective composition contains a water-soluble polyester resin (A) including a polyvalent carboxylic acid residue (a) and a polyvalent alcohol residue (b). The polyvalent carboxylic acid residue (a) includes: a polyvalent carboxylic acid residue (a1) having a metal sulfonate group; and a naphthalene dicarboxylic acid residue (a2). The proportion of the polyvalent carboxylic acid residue (a1) to the polyvalent carboxylic acid residue (a) falls within the range from 25 mol % to 70 mol %. The proportion of the naphthalene dicarboxylic acid residue (a2) to the polyvalent carboxylic acid residue (a) falls within the range from 30 mol % to 75 mol %.

According to this method, using the protective composition allows the protective coating 3 to be formed easily, also allows the protective coating 3 to protect the substrate 2 or the semiconductor device chips 1 from at least one of a laser beam or plasma, and reduces the chances of causing a decline in the water solubility of the protective coating 3 even when the protective coating 3 is exposed to at least one of a laser beam or plasma. This makes the protective coating 3 easily removable from the semiconductor device chips 1 using an aqueous cleaning fluid. Thus, the manufacturing efficiency of the semiconductor device chips 1 may be increased easily.

According to this method, the protective coating 3 may be irradiated with at least one of a laser beam or plasma for any purpose without limitation. For example, the protective coating 3 may be irradiated with at least one of a laser beam or plasma to remove the protective coating 3 at least partially from the substrate 2. More specifically, the protective coating 3 may be removed by laser ablation at least partially from the substrate 2 by irradiating the protective coating 3 with a laser beam, for example. This allows the protective coating 3 to protect the substrate 2 during the laser ablation. In addition, this also reduces, even when the substrate 2 is partially exposed through the protective coating 3 by laser ablation, the chances of causing a decline in the water-solubility of the protective coating 3, thus making the protective coating 3 easily removable with an aqueous cleaning fluid. In that case, the substrate 2 may be divided by any method. For example, the substrate 2 may be divided by irradiating the substrate 2 with at least one of a laser beam or plasma, which is not selected according to the method described above. Still alternatively, the substrate 2 may be divided with a blade, for example. When a blade is used, the substrate 2 does not have to be divided at a region from which the protective coating 3 has been removed but may be divided at a region interposed between two regions from which the protective coating 3 has been removed, for example. Also, when a blade is used, the protective coating 3 may be removed from the substrate 2 by bringing the protective coating 3 into contact with an aqueous cleaning fluid and then the substrate 2 may be divided using the blade.

Alternatively, the substrate 2 may also be divided into a plurality of semiconductor device chips 1 by removing a portion of the protective coating 3 from the substrate 2 and then irradiating the protective coating 3 and a portion, exposed by removing the portion of the protective coating 3, of the substrate 2 with the plasma. That is to say, the protective coating 3 may be used as a mask for plasma dicing. This allows the protective coating 3 to protect the substrate 2 from the plasma. In addition, this also makes even the protective coating 3 that has been irradiated with the plasma easily removable with the aqueous cleaning fluid. In that case, a portion of the protective coating 3 may be removed from the substrate 2 by any method without limitation. For example, to remove the protective coating 3 at least partially from the substrate 2, the protective coating 3 may be irradiated with at least one of a laser beam or plasma as described above. Alternatively, a portion of the protective coating 3 may also be removed from the substrate 2 by a mechanical method using a scribe, for example, or by a chemical method using a chemical liquid, for example.

Still alternatively, the substrate 2 may also be divided by removing a portion of the protective coating 3 from the substrate 2 with the protective coating 3 irradiated with at least one of a laser beam or plasma and then also irradiating a portion, exposed by removing the portion of the protective coating 3, of the substrate 2 with the laser beam and/or plasma.

In an exemplary embodiment of the present disclosure, a portion of the protective coating 3 is removed from the substrate 2 by irradiating the portion with a laser beam. Subsequently, the protective coating 3 and a portion, exposed by removing the portion of the protective coating 3, of the substrate 2 are irradiated with plasma, thereby dividing the substrate 2 into a plurality of semiconductor device chips 1. This this embodiment will now be described in further detail with reference to FIGS. 2-5. Note that the embodiment to be described below is only one of various embodiments of the present disclosure and should not be construed as limiting.

According to this embodiment, after the protective coating 3 has been formed to cover the substrate 2, a portion of the protective coating 3 is removed by laser ablation from the substrate 2 by irradiating the protective coating 3 with a laser beam, thereby forming grooves 31 through the protective coating 3 to expose the substrate 2 partially. Thereafter, the substrate 2 is cut off by plasma dicing along the grooves 31 to divide the substrate 2 into a plurality of semiconductor device chips 1. In this process step, not only the portions, exposed through the grooves 31, of the substrate 2 but also the protective coating 3 that covers the rest of the substrate 2 other than the portions exposed through the grooves 31 are irradiated with plasma as well. Thereafter, the protective coating 3 that covers the semiconductor device chips 1 is removed from the semiconductor device chips 1 by bringing the protective coating 3 into contact with an aqueous cleaning fluid.

According to this embodiment, semiconductor device chips 1 may be fabricated by performing laser ablation and plasma dicing after the protective coating 3 has been formed on the substrate 2. At this time, the protective coating 3 may be formed easily by using a protective composition. This allows the protective coating 3 to protect the substrate 2 and the semiconductor device chips 1 during the laser ablation and the plasma dicing.

Next, the manufacturing process of semiconductor device chips 1 according to this embodiment will be described in further detail.

First, the substrate 2 is provided. The substrate 2 is divided by dicing into a plurality of semiconductor device chips 1. The substrate 2 may be a wafer, for example. The wafer is made of a semiconductor. Examples of materials for the wafer include silicon (Si), gallium arsenide (GaAs), gallium nitride (GaN), and silicon carbide (SiC). Note that these are exemplary materials for the wafer and should not be construed as limiting. The wafer may have any size without limitation but may have a diameter of 50 mm to 450 mm and a thickness of 1 µm to 800 µm, for example. Note that as long as the substrate 2 may be divided by dicing into a plurality of semiconductor device chips 1, the substrate 2 does not have to be a semiconductor wafer. Alternatively, the substrate 2 may also be, for example, a multilayer stack in which a semiconductor wafer and a resin substrate, a metallic substrate, or a ceramic substrate are stacked one on top of the other. Furthermore, the semiconductor device chips 1 do not have to be chips, each including semiconductor devices such as transistors or integrated circuits. Alternatively, each of the semiconductor device chips 1 may also be a multilayer stack in which a semiconductor device and a layer of a material different from the semiconductor such as a metal layer, a resin layer, or a ceramic layer are stacked one on top of another. Still alternatively, each of the semiconductor device chips 1 may also be a multilayer stack in which a semiconductor device and a functional element such as an optical element or a MEMS element are stacked one on top of another.

Figure 2:
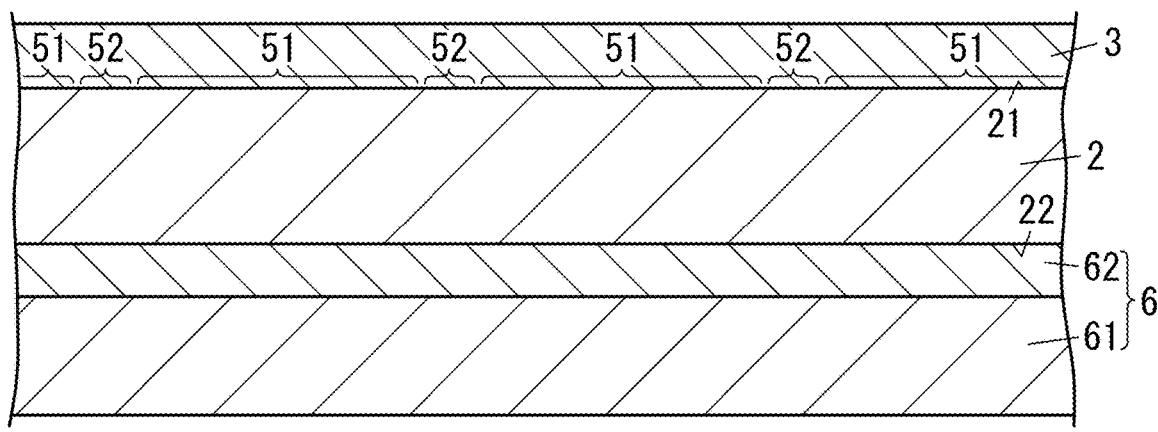
FIG. 2 is a schematic cross-sectional view illustrating a process step for fabricating semiconductor device chips according to the exemplary embodiment of the present disclosure.

The substrate 2 includes a first surface 21 and a second surface 22 facing the opposite direction from the first surface 21 (see FIGS. 1 and 2). As shown in FIG. 1, the substrate 2 has, on the first surface 21 thereof, a plurality of chip areas 51 and cutting areas 52, each of which is provided between a pair of chip areas 51 that are adjacent to each other. In each of the chip areas 51, an integrated circuit has been formed.

This substrate 2 is covered with the protective coating 3. To form the protective coating 3, the substrate 2 may be held by a holder 6 as shown in FIG. 2, for example. The substrate 2 may be held by the holder 6 either before an integrated circuit is formed thereon or after an integrated circuit has been formed thereon, whichever is appropriate. The holder 6 includes a body 61 and a pressure sensitive adhesive layer 62 that covers one surface of the body 61. The body 61 is made of a thermoplastic resin such as polyolefin or polyester. The pressure sensitive adhesive layer 62 may be made of a pressure sensitive adhesive such as a UV curable acrylic pressure sensitive adhesive. The pressure sensitive adhesive layer 62 may have a thickness of 5 µm to 20 µm, for example. The substrate 2 is held by the holder 6 by laying the second surface 22 of the substrate 2 on top of the pressure sensitive adhesive layer 62 of the holder 6.

The protective coating 3 may be formed by applying the protective composition onto the first surface 21 of the substrate 2 that is already held by the holder 6 and then drying the protective coating 3 as needed.

The protective composition may be applied by any method without limitation. For example, the protective composition may be applied either by spray coating or spin coating or by spray coating and spin coating in combination. To dry the coating of the protective composition applied, the coating may be heated, for example, to a temperature lower than the heatproof temperature of the holder 6, e.g., to a temperature of 60° C. or less. Optionally, the coating may be dried under a reduced pressure. The thickness of the coating may be set at any appropriate value and is not limited to any particular value.

Figure 3:
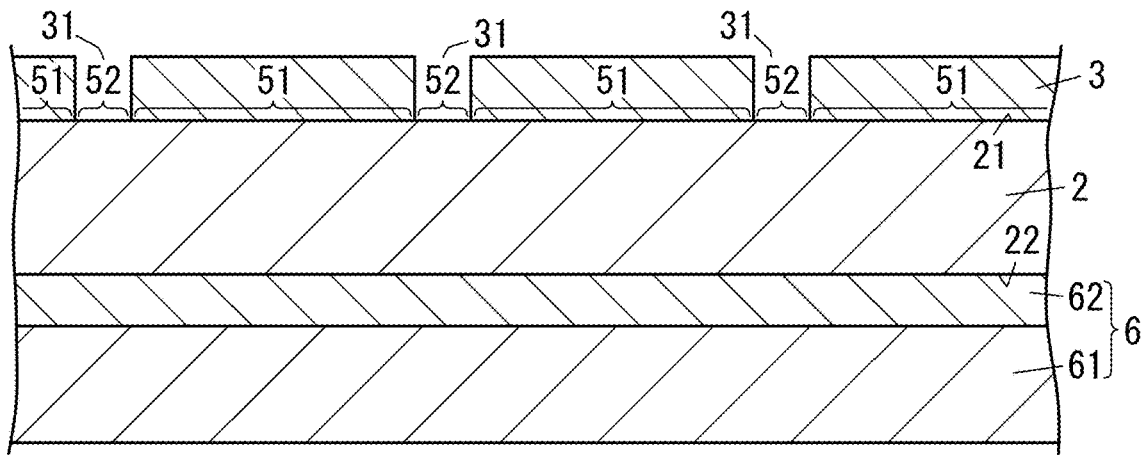
FIG. 3 is a schematic cross-sectional view illustrating another process step for fabricating semiconductor device chips according to the exemplary embodiment of the present disclosure.

Next, grooves 31 are formed through the protective coating 3 as shown in FIG. 3 by removing portions of the protective coating 3 by laser ablation. Forming the grooves 31 by laser ablation will be hereinafter referred to as "laser grooving." When laser grooving is performed, portions, covering the cutting areas 52 of the substrate 2, of the protective coating 3 are irradiated with the laser beam and thereby removed from the substrate 2. This allows grooves 31, reaching the cutting areas 52, to be formed through the protective coating 3. That is to say, the cutting areas 52, forming parts of the first surface 21 of the substrate 2, are exposed inside the grooves 31. Even if debris is left as a result of laser grooving, the chip areas 51 on the first surface 21 of the substrate 2 are still protected because the chip areas 51 are covered with the protective coating 3.

A light source for use in laser grooving may be, for example, a nanosecond laser diode that emits a laser beam with a UV wavelength (of 355 nm, for example). The laser beam may be radiated under the condition including a pulse frequency of 50 kHz, an output of 0.1 W, and a laser beam spot moving velocity of 100 mm/s, for example. However, this condition is only an example and should not be construed as limiting.

Figure 4:
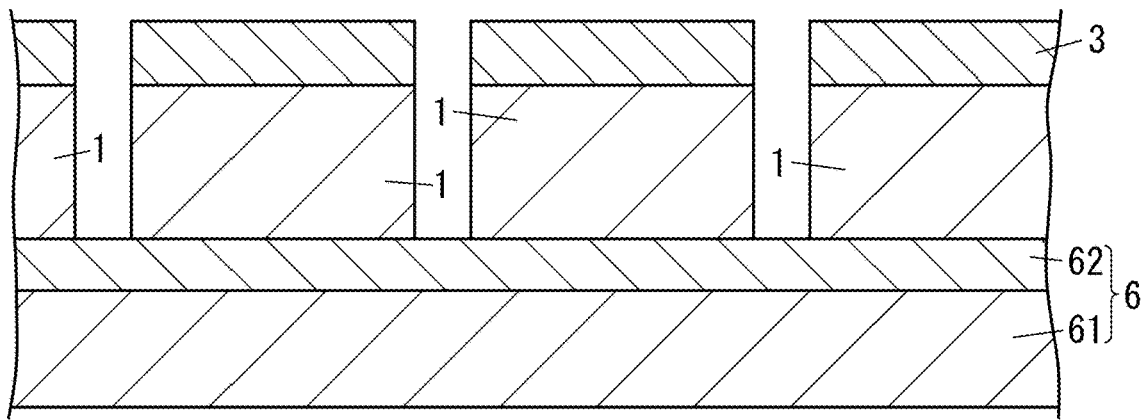
FIG. 4 is a schematic cross-sectional view illustrating still another process step for fabricating semiconductor device chips according to the exemplary embodiment of the present disclosure.

Next, the substrate 2 is divided by plasma dicing into a plurality of semiconductor device chips 1 as shown in FIG. 4. The protective coating 3 serves as a mask in this plasma dicing process step. To perform plasma dicing, a plasma processor is used. For example, when an inductively coupled plasma processor including a coil as a plasma source is used, the substrate 2 is arranged on a stage provided in a chamber of the plasma processor so as to be held by the holder 6. A process gas is supplied into the chamber and RF power is supplied to a coil provided in the chamber and a lower electrode built in the stage, thereby generating plasma in the chamber and exposing the protective coating 3 and the cutting areas 52 inside the grooves 31 to the plasma. This allows the substrate 2 to be cut off by plasma etching along the cutting areas 52. During this plasma dicing, the chip areas 51 are protected from the plasma by the protective coating 3. In this manner, a plurality of semiconductor device chips 1 are obtained. At a point in time when the substrate 2 is cut off, the chip areas 51 of the semiconductor device chips 1 are covered with the protective coating 3.

The condition for generating plasma may be set, for example, according to the material for the substrate 2. For example, if the substrate 2 includes silicon, then the substrate 2 may be patterned by Bosch process. The Bosch process includes etching silicon in the depth direction by repeatedly performing a deposition step, a deposited coating etching step, and an Si etching step in this order a number of times.

The deposition step may be carried out for 2 to 15 seconds with the in-chamber pressure adjusted to the range from 15 Pa to 25 Pa while a $C_4F_8$ gas is supplied as a process gas into the chamber at a flow rate of 150 sccm to 250 sccm and with a power of 1500 W to 2500 W applied to the coil and a power of 0 W to 50 W applied to the lower electrode, for example.

The deposited coating etching step may be carried out for 2 to 10 seconds with the in-chamber pressure adjusted to the range from 5 Pa to 15 Pa while an $SF_6$ gas is supplied as a process gas into the chamber at a flow rate of 200 sccm to 400 sccm and with a power of 1500 W to 2500 W applied to the coil and a power of 300 W to 1000 W applied to the lower electrode, for example.

The Si etching step may be carried out for 10 to 20 seconds with the in-chamber pressure adjusted to the range from 5 Pa to 15 Pa while an $SF_6$ gas is supplied as a process gas into the chamber at a flow rate of 200 sccm to 400 sccm and with a power of 1500 W to 2500 W applied to the coil and a power of 50 W to 500 W applied to the lower electrode, for example.

Performing the deposition step, the deposited coating etching step, and the Si etching step in this order repeatedly under such a condition causes the substrate 2 including silicon to be etched in the depth direction at a rate of 10 µm/min to 20 µm/min and also causes portions in the cutting areas 52 of the substrate 2 to be etched through the holder 6, thus cutting off the substrate 2 held by the holder 6 into a plurality of semiconductor device chips 1.

Figure 5:
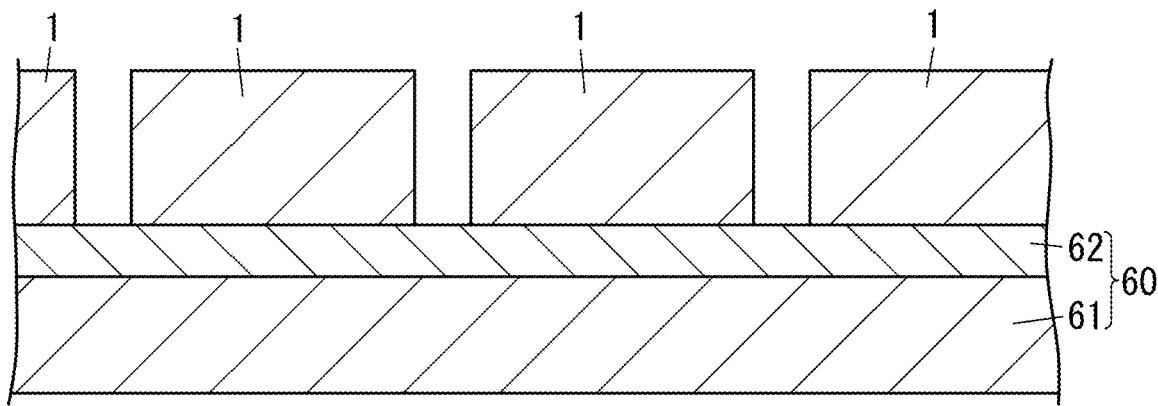
FIG. 5 is a schematic cross-sectional view illustrating yet another process step for fabricating semiconductor device chips according to the exemplary embodiment of the present disclosure.

Next, the protective coating 3 that covers the respective semiconductor device chips 1 is brought into contact with an aqueous cleaning fluid and thereby removed from the semiconductor device chips 1 as shown in FIG. 5. The aqueous cleaning fluid may be either water or a mixed solvent including water and an organic solvent, whichever is appropriate. The organic solvent contains at least one solvent selected from the group consisting of methanol, ethanol, acetone, methyl ethyl ketone, acetonitrile, and dimethyl acetoamide. Note that these organic solvents are only examples and should not be construed as limiting. Optionally, the aqueous cleaning fluid may contain an additive as needed. Examples of the additives include acids, surfactants, and metal anticorrosive agents. When the protective coating 3 is brought into contact with the aqueous cleaning fluid, the protective coating 3 may be immersed in the aqueous cleaning fluid or the aqueous cleaning fluid may be sprayed onto the protective coating 3. Alternatively, the protective coating 3 may also be brought into contact with the aqueous cleaning fluid by any other method. After the protective coating 3 has been removed, the respective semiconductor device chips 1 are removed from the holder 6.

The protective composition will be described in further detail.

As described above, the protective composition contains a water-soluble polyester resin (A) including a polyvalent carboxylic acid residue (a) and a polyvalent alcohol residue (b).

The water-soluble polyester resin (A) is a polymeric product of monomer components including a polyvalent carboxylic acid component and a glycol component, for example. This allows the water-soluble polyester resin (A) to include a polyvalent carboxylic acid residue (a) derived from the polyvalent carboxylic acid component and a polyvalent alcohol residue (b) derived from the glycol component.

It belongs to a technical commonplace to determine that the water-soluble polyester resin (A) should have water solubility. It is particularly suitable that the water-soluble polyester resin (A) is dissolvable in water even without using any dispersive agent such as a hydrophilic organic solvent or a surfactant. For example, the water-soluble polyester resin (A) is suitably dissolved entirely in water by mixing the water-soluble polyester resin (A) and water at 90° C. at a ratio by mass of one to three and stirring the mixture up at a sufficiently high velocity for 2 hours while maintaining the temperature of the solution thus obtained at 90° C.

The polyvalent carboxylic acid component includes at least one compound selected from the group consisting of polyvalent carboxylic acid, of which the valence is equal to or greater than two, and an ester-forming derivative of the polyvalent carboxylic acid. Examples of the ester-forming derivatives of the polyvalent carboxylic acid include derivatives of the polyvalent carboxylic acid such as anhydrides, esters, acid chlorides, and halides of the polyvalent carboxylic acid. The ester-forming derivative of the polyvalent carboxylic acid is a compound that forms an ester by reacting to a polyvalent alcohol component to be described later. The polyvalent carboxylic acid has two or more carboxy groups per molecule.

The polyvalent alcohol component includes at least one compound selected from the group consisting of a polyvalent alcohol, of which the valence is equal to or greater than two, and an ester-forming derivative of the polyvalent alcohol. Examples of the ester-forming derivatives of the polyvalent alcohol include derivatives of the polyvalent alcohol such as a diacetate compound corresponding to the polyvalent alcohol. The ester-forming derivative of the polyvalent alcohol is a compound that forms an ester by reacting to the polyvalent carboxylic acid component. The polyvalent alcohol has two or more hydroxy groups per molecule.

Furthermore, the monomer component may contain a compound including: a carboxy group or an ester-forming derivative group thereof such as hydroxy acid, an ester-forming derivative of hydroxy acid, and lactone; and a hydroxy group and an ester-forming derivative group thereof.

The polyvalent carboxylic acid residue (a) suitably has no reactive functional groups but the carboxy group and the ester-forming derivative group thereof. Likewise, the polyvalent alcohol residue (b) suitably has no reactive functional groups but the hydroxy group and the ester-forming derivative group thereof. As used herein, the reactive functional groups refer to, for example, ethylenic unsaturated bonds and reaction groups such as an amino group, an imino group, a hydrazino group, a nitro group, an epoxy group, a cyano group, and an azo group.

It is particularly suitable that neither the polyvalent carboxylic acid residue (a) nor the polyvalent alcohol residue (b) includes any reactive functional group. In those cases, the number of the reactive functional groups of the water-soluble polyester resin (A) will decrease or the water-soluble polyester resin (A) will have no reactivity. Then, even if the water-soluble polyester resin (A) is heated to be dried after having been applied onto the substrate 2, or heated by being irradiated with a laser beam in the laser ablation process step, or heated by being exposed to plasma in the plasma dicing process step, the chances of causing a decline in the water solubility of the water-soluble polyester resin (A) may be reduced. Note that the metal sulfonate group does not count among the reactive functional groups.

As described above, the polyvalent carboxylic acid residue (a) includes: a polyvalent carboxylic acid residue (a1) having a metal sulfonate group; and a naphthalene dicarboxylic acid residue (a2). The polyvalent carboxylic acid residue (a1) having the metal sulfonate group imparts good water solubility to the water-soluble polyester resin (A), thus making the protective coating 3 easily removable with the aqueous cleaning fluid. In addition, the naphthalene dicarboxylic acid residue (a2) causes the protective coating 3 to absorb the laser beam easily, thus facilitating forming grooves 31 through the protective coating 3 by laser ablation. Furthermore, the naphthalene dicarboxylic acid residue (a2) allows the protective coating 3 to have sufficient plasma resistance to make it easier to fabricate semiconductor device chips 1 by plasma dicing. Furthermore, the water-soluble polyester resin (A) has no reactive functional groups, and therefore, does not tend to discolor a metallic part of the substrate 2.

The polyvalent carboxylic acid residue (a1) having the metal sulfonate group includes at least one selected from the group consisting of: a residue of an alkali metal salt of 5-sulfoisophthalic acid; a residue of an alkali metal salt of 2-sulfoisophthalic acid; a residue of an alkali metal salt of 4-sulfoisophthalic acid; a residue of an alkali metal salt of sulfoterephthalic acid; and a residue of an alkali metal salt of 4-sulfonaphthalene-2,6-dicaboxylate. To impart good water solubility to the water-soluble polyester resin (A), the alkali metal is suitably sodium, potassium, or lithium. Particularly when the polyvalent carboxylic acid residue having the metal sulfonate group includes a residue of sodium 5-sulfoisophthalate (such as a residue of dimethyl sodium 5-sulfoisophthalate or a residue of sodium 5-sulfoisophthalate), a sodium sulfonate group will remain effectively in the water-soluble polyester resin (A), thus imparting good water solubility to the water-soluble polyester resin (A).

The proportion of the polyvalent carboxylic acid residue (a1) having the metal sulfonate group to the polyvalent carboxylic acid residue (a) falls within a range from 25 mol % to 70 mol %. This makes the protective coating 3 easily removable with an aqueous cleaning fluid. This proportion more suitably falls within the range from 30 mol % to 65 mol %, and even more suitably falls within the range from 35 mol % to 60 mol %.

The proportion of the naphthalene dicarboxylic acid residue (a2) to the polyvalent carboxylic acid residue (a) falls within the range from 30 mol % to 75 mol %. This allows the protective coating 3 to exhibit particularly high absorbance with respect to a laser beam with a wavelength of around 355 nm. This increases the efficiency of laser grooving more easily even if the protective composition does not contain any laser beam absorbent, thus increasing the manufacturing efficiency of semiconductor device chips 1 effectively. In addition, adding no laser beam absorbent to the protective composition tends to increase the stability of the protective composition and reduces the chances of causing the laser beam absorbent's bleeding out from the protective coating 3 and other problems. This proportion more suitably falls within the range from 35 mol % to 70 mol % and even more suitably falls within the range from 40 mol % to 65 mol %.

The polyvalent carboxylic acid residue (a) may contain only the polyvalent carboxylic acid residue (a1) having the metal sulfonate group and the naphthalene dicarboxylic acid residue (a2). Alternatively, the polyvalent carboxylic acid residue (a) may also contain another polyvalent carboxylic acid residue (a3) other than these.

The polyvalent carboxylic acid residue (a3) contains a dicarboxylic acid residue such as an aromatic dicarboxylic acid residue and an aliphatic dicarboxylic acid residue. Among other things, the polyvalent carboxylic acid residue suitably contains at least one selected from the group consisting of: residues of aromatic dicarboxylic acids such as a terephthalic acid residue and an isophthalic acid residue; and residues of aliphatic dicarboxylic acids such as a succinic acid residue, an adipic acid residue, a sebacic acid residue, a dodecane diacid residue, and 1,4-cyclohexane dicarboxylic acid residue. This allows the water-soluble polyester resin (A) to have good durability. Particularly when the polyvalent carboxylic acid residue (a3) contains at least one aliphatic dicarboxylic acid residue selected from the group consisting of a succinic acid residue, an adipic acid residue, a sebacic acid residue, a dodecane diacid residue, and 1,4-cyclohexane dicarboxylic acid residue, the glass transition temperature of the water-soluble polyester resin (A) may be decreased easily. The naphthalene dicarboxylic acid residue (a2) tends to increase the glass transition temperature of the water-soluble polyester resin (A). However, if the water-soluble polyester resin (A) further contains a residue of an aliphatic dicarboxylic acid, that reduces the chances of the water-soluble polyester resin (A) having an excessively high glass transition temperature.

The polyvalent alcohol residue suitably contains a glycol residue. The glycol residue suitably includes at least one glycol residue selected from the group consisting of: an ethylene glycol residue, a diethylene glycol residue, a polyethylene glycol residue, a residue of a butanediol such as 1,4-butanediol residue, a residue of a hexanediol such as a 1,6-hexanediol residue, and a neopentyl glycol residue. This allows the water-soluble polyester resin (A) to have good durability and may decrease the glass transition temperature of the water-soluble polyester resin (A) easily. The residues included in the polyvalent alcohol residue are not limited to these but may further include a residue of 1,4-cyclohexanedimethanol, a bisphenol A residue, a bisphenol fluorene residue, and bisphenoxy ethanol fluorene residue, for example.

If the water-soluble polyester resin (A) is synthesized out of a polyvalent carboxylic acid component and a polyvalent alcohol component, then the proportions of the polyvalent carboxylic acid component and the polyvalent alcohol component are suitably adjusted such that the molar ratio of the total number of carboxy groups and ester-forming derivative groups thereof included in the polyvalent carboxylic acid component to the total number of hydroxy groups and ester-forming derivative groups thereof included in the polyvalent alcohol component falls within the range from 1:1.1 to 1:2.5.

The water-soluble polyester resin (A) may be produced by polymerizing the polyvalent carboxylic acid component and the polyvalent alcohol component together by a known method of making a polyester.

If the polyvalent carboxylic acid component is polyvalent carboxylic acid and the polyvalent alcohol component is polyvalent alcohol, then a direct esterification reaction of producing a reaction between the polyvalent carboxylic acid and the polyvalent alcohol in a single stage may be adopted, for example.

If the polyvalent carboxylic acid component is an ester-forming derivative of polyvalent carboxylic acid and the polyvalent alcohol component is polyvalent alcohol, then the water-soluble polyester resin (A) may be produced through a first-stage reaction which is a transesterification reaction between the ester-forming derivative of polyvalent carboxylic acid and polyvalent alcohol and a second-stage reaction in which a reaction product of the first-stage reaction causes polycondensation.

A method for producing a water-soluble polyester resin (A) through the first-stage reaction and the second-stage reaction will be described more specifically. In the transesterification reaction as the first-stage reaction, every material used for producing the water-soluble polyester resin (A) may be contained from the beginning in the reaction system. The transesterification reaction may be advanced by, for example, gradually heating, and increasing the temperature of, diester dicarboxylate and polyvalent alcohol to a temperature between 150° C. and 260° C. under an ordinary pressure within an inert gas atmosphere such as nitrogen gas while holding the diester dicarboxylate and polyvalent alcohol in a reaction vessel.

The polycondensation reaction as the second-stage reaction may be advanced under a reduced pressure of 6.7 hPa (=5 mmHg) or less and at a temperature of 160° C. to 280° C., for example.

At an arbitrary point in time during the first-stage reaction and the second-stage reaction, titanium, antimony, lead, zinc, magnesium, calcium, manganese, an alkali metal compound, or any other suitable substance may be added as a catalyst to the reaction system.

The number average molecular weight of the water-soluble polyester resin (A) suitably falls within the range from 1000 to 50000. If the number average molecular weight is equal to or greater than 1000, then the protective coating 3 tends to have sufficient strength. If the number average molecular weight is equal to or less than 50000, then the water solubility of the water-soluble polyester resin (A) increases so much as to cause an effective increase in the water solubility of the protective coating. The number average molecular weight of the water-soluble polyester resin (A) more suitably falls within the range from 2000 to 40000.

Note that the number average molecular weight of the water-soluble polyester resin (A) may be derived based on the result of measurement by gel permeation chromatograph (by being polystyrene converted).

The degree of water solubility of the water-soluble polyester resin (A) may be adjusted by striking an adequate balance between the number average molecular weight of the water-soluble polyester resin (A) and the proportion of the polyvalent carboxylic acid residue (a1) having the metal sulfonate group to the water-soluble polyester resin (A). In other words, the number average molecular weight of the water-soluble polyester resin (A) and the proportion of the polyvalent carboxylic acid residue (a1) having the metal sulfonate group are suitably set appropriately to allow the water-soluble polyester resin (A) to have sufficiently high water solubility. Also, the water-soluble polyester resin (A) suitably has an acid number of 10 mgKOH/g or less. If the acid number thereof is 10 mgKOH/g or less, the water-soluble polyester resin (A) does not tend to discolor the metal part of the substrate 2.

The water-soluble polyester resin (A) suitably has a glass transition temperature of 10° C. to 100° C. If the glass transition temperature is equal to or higher than 10° C., the protective coating 3 will not become excessively adhesive, thus often making it easier to handle the protective coating 3. If the glass transition temperature is equal to or lower than 100° C., it is much easier to form a coating of the water-soluble polyester resin (A), thus often achieving a sufficient degree of close contact between the protective coating 3 and the substrate 2. The glass transition temperature more suitably falls within the range from 20° C. to 80° C. and even more suitably falls within the range from 40° C. to 65° C. Note that the glass transition temperature may be derived based on the results of differential scanning calorimetry.

The proportion of the water-soluble polyester resin (A) in the protective composition suitably falls within the range from 1% by mass to 100% by mass, more suitably falls within the range from 10% by mass to 90% by mass, and even more suitably falls within the range from 15% by mass to 80% by mass, with respect to the solid content (nonvolatile components) of the protective composition.

The protective composition may further contain an additional aqueous resin other than the water-soluble polyester resin (A). The presence of the additional aqueous resin may increase the degree of applicability of the protective composition by adjusting the viscosity of the protective composition, for example. The aqueous resin contains at least one material selected from the group consisting of polyvinyl alcohol, polyurethane, an acrylic resin, a cellulose derivative, modified polypropylene, and modified polyethylene, for example.

The protective composition may contain an appropriate additive. The additive contains at least one agent selected from the group consisting of a leveling agent, an antioxidant, an ultraviolet absorbent and a defoamer, for example.

The protective composition may contain at least one of water or a hydrophilic organic solvent. This allows the degree of applicability of the protective composition to be increased by adjusting the viscosity of the protective composition, for example. The hydrophilic organic solvent contains at least one selected from the group consisting of: alcohols such as methanol, ethanol, 2-propanol, and 1,2-propanediol; glycol ethers such as propylene glycol monomethyl ether, ethyl cellosolve, and n-butyl cellosolve; and ketones such as acetone, methyl ethyl ketone, and cyclohexanone.

The protective composition according to this embodiment may be applied easily by spray coating or spin coating, in particular.

The viscosity at room temperature of the protective composition suitably falls within the range from 0.5 mPa·s to 1000 mPa·s. This allows the protective composition to be applied onto the substrate 2 particularly easily and facilitates forming the applied protective composition into a coating shape. The protective composition is applicable particularly easily when applied by either spray coating or spin coating, among other things. Note that the viscosity may be measured with a vibrating viscometer. When applied by spray coating, the protective composition more suitably has a viscosity of 0.5 mPa·s to 100 mPa·s. When applied by spin coating, the protective composition more suitably has a viscosity of 20 mPa·s to 1000 mPa·s.

EXAMPLES

Specific examples of this embodiment will now be described. Note that the following are only examples of the present disclosure and should not be construed as limiting.

1. Preparation of Composition

A reaction vessel having a capacity of 1000 ml and including a stirrer, a nitrogen gas inlet port, a thermometer, a rectifying tower, and a cooling condenser was provided. Into this reaction vessel, the materials shown in the following Table 1 and titanium potassium oxalate as a catalyst were introduced to obtain a mixture. This mixture had its temperature raised to 200° C. while being stirred up and mixed under an ordinary pressure and in a nitrogen atmosphere and then had its temperature gradually raised to 250° C. in 4 hours, thereby completing a transesterification reaction. Next, this mixture had its pressure gradually reduced to 0.67 hPa (=0.5 mmHg) at a temperature of 250° C. and was maintained in that state for 2 hours to advance the polycondensation reaction. In this manner, a polyester resin was obtained.

Next, 50 parts by mass of this polyester resin and 150 parts by mass of water were mixed together and then the mixture was maintained at a temperature of 90° C. for 2 hours while being stirred up, thereby obtaining a composition with a polyester resin concentration of 25% by mass.

When applied by spray coating, the composition had its viscosity adjusted to the range of 0.5 mPa·s to 100 mPa·s. On the other hand, when applied by spin coating, the composition had its viscosity adjusted to the range of 20 mPa·s to 1000 mPa·s.

2. Evaluation of Physical Properties (1) Number Average Molecular Weight

The number average molecular weight of the composition was derived based on the results of measurement using a gel permeation chromatograph (by being polystyrene converted).

(2) Glass Transition Temperature

The glass transition temperature of the polyester resin in the composition was derived based on the results of measurement of differential scanning calorimetry.

(3) Acid Number

The acid number of the polyester resin in the composition was measured by titration using an ethanol solution of potassium hydroxide.

3. Property Evaluation (1) Applicability

The composition was applied by spray coating onto a single-crystal silicon substrate with a diameter of 300 nm and then dried naturally to form a protective coating with a thickness of 10 μm or 30 μm thereon. The applicability of the coating in this case was rated as follows by observing its surface using an optical microscope and by measuring the coating thickness distribution using a near-infrared ray interference coating thickness gauge.

The applicability was also rated in the same way when the method for applying the composition was changed into spin coating.

Grade A: when non-uniformity was recognized nowhere in the coating thus formed and the coating thickness had an in-plane uniformity less than 10%;

Grade B: when non-uniformity was recognized here and there in the coating thus formed but the coating thickness had an in-plane uniformity less than 10%; and Grade C: when non-uniformity was recognized almost everywhere in the coating thus formed and the coating thickness had an in-plane uniformity equal to or greater than 10%.

(2) Degree of Close Contact

The composition was applied by spray coating onto a single-crystal silicon substrate with a diameter of 300 nm and then dried naturally to form a protective coating with a thickness of 10 μm or 30 μm. The conditions of this protective coating were rated as follows by observing the protective coating through an optical microscope.

The degree of close contact was also rated in the same way when the method for applying the composition was changed into spin coating.

Grade A: when cracks or peeling was recognized nowhere in the protective coating;

Grade B: when cracks and/or peeling was recognized here and there in the protective coating; and Grade C: when cracks and/or peeling was recognized almost everywhere in the protective coating.

(3) Laser Patternability

The composition was applied by spray coating onto a single-crystal silicon substrate with a diameter of 300 nm and then dried naturally to form a protective coating with a thickness of 10 μm or 30 μm.

The protective coating was subjected to laser ablation in which the protective coating was irradiated with a UV laser beam (with a wavelength of 355 nm) using a Q switch laser diode to form grooves with a width of about 20 μm. The laser patternability of the protective coating was rated as follows based on the results.

The laser patternability was also rated in the same way when the method for applying the composition was changed into spin coating.

Grade A: when the coating could be patterned into a desired shape with peeling recognized nowhere between the protective coating and the substrate;

Grade B: when the coating could be patterned into the desired shape with peeling recognized here and there between the protective coating and the substrate; and Grade C: when the coating could not be patterned into the desired shape with peeling recognized between the protective coating and the substrate.

(4) Plasma Resistance

The composition was applied by spray coating onto a single-crystal silicon substrate with a diameter of 300 nm and then dried naturally to form a protective coating with a thickness of 10 μm or 30 μm. This protective coating was subjected to laser patterning to form grooves thereon. Thereafter, the protective coating was subjected to plasma dicing for 20 minutes. Then, the conditions of the protective coating were rated as follows by observing the conditions thereof through an electron microscope.

The plasma resistance was also rated in the same way when the method for applying the composition was changed into spin coating.

Grade A: when neither peeling between the protective coating and the substrate nor burning of the protective coating was recognized:

Grade B: when peeling between the protective coating and the substrate and burning of the protective coating were recognized here and there: and Grade C: when peeling between the protective coating and the substrate and burning of the protective coating were recognized almost everywhere.

Note that the plasma processing to evaluate the plasma resistance and the removability (to be described later) was carried out under generally the same condition as the plasma dicing machining. Specifically, the deposition, deposited coating etching, and Si etching steps of the Bosch process were performed repeatedly until the total processing time reached 20 minutes or more. In this case, the deposition step was performed for 8 seconds under the condition in which the in-chamber pressure was adjusted to 20 Pa with a $C_4F_8$ gas supplied as a process gas into the chamber at a flow rate of 200 sccm, with a power of 2000 W applied to the coil, and with a power of 25 W applied to the lower electrode. The deposited coating etching step was performed for 6 seconds under the condition in which the in-chamber pressure was adjusted to 10 Pa with an $SF_6$ gas supplied as a process gas into the chamber at a flow rate of 300 sccm, with a power of 2000 W applied to the coil, and with a power of 650 W applied to the lower electrode. The Si etching step was performed for 15 seconds under the condition in which the in-chamber pressure was adjusted to 10 Pa with an $SF_6$ gas supplied as a process gas into the chamber at a flow rate of 300 sccm, with a power of 2000 W applied to the coil, and with a power of 275 W applied to the lower electrode.

In the sample rated as Grade A, the etch rate of the protective coating during plasma dicing was much lower than (specifically, one-tenth or less of) the etch rate of the silicon substrate.

(5) Removability #1

The composition was applied by spray coating onto a single-crystal silicon substrate with a diameter of 300 nm in an atmosphere at 23° C. and then dried naturally to form a protective coating with a thickness of 5 μm. The protective coating was cleaned with two fluids for 90 seconds using water as an aqueous cleaning fluid under the condition including a flow rate of 1.94 L/min and a water temperature of 30° C. After that, the appearance of the substrate was observed, thereby rating the removability of the protective coating as follows.

The removability was also rated in the same way when the method for applying the composition was changed into spin coating.

Grade A: when no protective coating residue was recognized on the substrate;
Grade B: when protective coating residues were recognized here and there on the substrate; and
Grade C: when protective coating residues were recognized almost everywhere on the substrate.

(6) Removability #2

The composition was applied by spray coating onto a single-crystal silicon substrate with a diameter of 300 nm in an atmosphere at 23° C. and then dried naturally to form a protective coating with a thickness of 5 μm. The protective coating was subjected to laser ablation in which the protective coating was irradiated with a UV laser beam (with a wavelength of 355 nm) using a Q switch laser diode to form grooves with a width of about 20 μm. Subsequently, the protective coating was subjected to plasma dicing for 20 minutes or more. Thereafter, the protective coating was cleaned with two fluids for 90 seconds using water as an aqueous cleaning fluid under the condition including a flow rate of 1.94 L/min and a water temperature of 30° C. After that, the appearance of the substrate was observed, thereby rating the removability of the protective coating as follows:

The removability was also rated in the same way when the method for applying the composition was changed into spin coating.

Grade A: when no protective coating residue was recognized on the substrate;
Grade B: when protective coating residues were recognized here and there on the substrate; and
Grade C: when protective coating residues were recognized almost everywhere on the substrate.

TABLE 1

| | | | Examples | | | | | | | | Comparative Exampes | | | |
|---|---|---|---|---|---|---|---|---|---|---|---|---|---|---|
| | | | 1 | 2 | 3 | 4 | 5 | 6 | 7 | 8 | 1 | 2 | 3 | 4 |
| Material Components/ Parts by Mass (Parts by mole) | Polyvalent carboxylic acid components | 2,6-dimethyl naphthalene dicarboxylate | 73.3 (0.30) | 97.7 (0.40) | 97.7 (0.40) | 122.1 (0.50) | 122.1 (0.50) | 146.5 (0.60) | 146.5 (0.60) | 158.8 (0.65) | 171.0 (0.70) | 171.0 (0.70) | 48.8 (0.20) | 48.8 (0.20) |
| | | 5-dimethyl sodium sulfoisophthalate | 177.7 (0.60) | 148.1 (0.50) | 148.1 (0.50) | 118.5 (0.40) | 118.5 (0.40) | 88.9 (0.30) | 88.9 (0.30) | 74.1 (0.25) | 29.6 (0.10) | 59.2 (0.20) | 118.5 (0.40) | 29.6 (0.10) |
| | | dimethyl terephthalate | 19.4 (0.10) | 19.4 (0.10) | | | | | | | 38.8 (0.20) | 19.4 (0.10) | | |
| | | dimethyl isophthalate | | | | 19.4 (0.10) | | | | | | | 77.7 (0.40) | 135.9 (0.70) |
| | | sebacic acid | | | | 20.2 (0.10) | | 20.2 (0.10) | 20.2 (0.10) | | | | | |
| | | 1,4-cyclohexane dicarboxylate | | | | | | | 17.2 (0.10) | 17.2 (0.10) | | | | |
| | Polyvalent alcohol components | ethylene glycol | 99.3 (1.60) | 99.3 (1.60) | 99.3 (1.60) | 99.3 (1.60) | 99.3 (1.60) | 99.3 (1.60) | 99.3 (1.60) | 99.3 (1.60) | 124.1 (2.00) | 99.3 (1.60) | 99.3 (1.60) | 99.3 (1.60) |
| | | diethylene glycol | 21.2 (0.20) | 21.2 (0.20) | | | | | | | | | | |
| | | neopentyl glycol | | | | 20.8 (0.20) | 20.8 (0.20) | 20.8 (0.20) | | | | | 20.8 (0.20) | 20.8 (0.20) |
| | | 1,6-hexanediol | 23.6 (0.20) | 23.6 (0.20) | 23.6 (0.20) | | | 23.6 (0.20) | 23.6 (0.20) | 23.6 (0.20) | | 23.6 (0.20) | 23.6 (0.20) | 23.6 (0.20) |
| | | polyethylene glycol (Mn: 200) | | | | 40.0 (0.20) | | 40.0 (0.20) | | | | | | |
| | | polyethylene glycol (Mn: 400) | | | | | 80.0 (0.20) | | 80.0 (0.20) | 80.0 (0.20) | | 80.0 (0.20) | | |

TABLE 1-continued

|  |  |  | Examples | | | | | | | | Comparative Exampes | | | |
| --- | --- | --- | --- | --- | --- | --- | --- | --- | --- | --- | --- | --- | --- | --- |
|  |  |  | 1 | 2 | 3 | 4 | 5 | 6 | 7 | 8 | 1 | 2 | 3 | 4 |
|  | Catalyst | titanium potassium oxalate | 0.1 | 0.1 | 0.1 | 0.1 | 0.1 | 0.1 | 0.1 | 0.1 | 0.1 | 0.1 | 0.1 | 0.1 |
| Physical Properties | Number average molecular weight |  | 6550 | 7860 | 8330 | 9220 | 8910 | 9660 | 10210 | 10650 | 10580 | 13200 | 8610 | 12310 |
|  | Glass transition temperature (°C.) |  | 66 | 68 | 60 | 61 | 41 | 60 | 38 | 45 | 108 | 45 | 64 | 61 |
|  | Acid number (mgKOH/g) |  | 7 | 6 | 5 | 5 | 4 | 3 | 2 | 3 | 2 | 4 | 6 | 3 |
| Evaluation | Applicability | Spray coating | A | B | A | A | A | A | A | A | C | A | A | A |
|  |  | Spin coating | A | A | A | A | A | A | A | A | C | A | A | A |
|  | Degree of close contact | Spray coating | A | B | A | A | A | A | A | A | C | A | A | A |
|  |  | Spin coating | A | A | A | A | A | A | A | A | C | A | A | A |
|  | Laser patternability | Spray coating | B | A | A | A | A | A | A | A | C | A | C | C |
|  |  | Spin coating | B | A | A | A | A | A | A | A | C | A | C | C |
|  | Plasma resistance | Spray coating | B | A | A | A | A | A | B | A | C | A | C | C |
|  |  | Spin coating | B | A | A | A | A | A | B | A | C | A | C | C |
|  | Removability #1 | Spray coating | A | A | A | A | A | A | A | A | C | B | A | C |
|  |  | Spin coating | A | A | A | A | A | A | A | A | C | B | A | C |
|  | Removability #2 | Spray coating | A | A | A | A | A | A | A | B | C | C | A | C |
|  |  | Spin coating | A | A | A | A | A | A | A | B | C | C | A | C |

As can be seen easily from the foregoing description of embodiments and examples, a method for fabricating semiconductor device chips (1) according to a first aspect of the present disclosure is a method for fabricating semiconductor device chips (1) by dividing a substrate (2) into a plurality of semiconductor device chips (1). The method includes: forming a protective coating (3) that covers the substrate (2) by applying a protective composition onto the substrate (2); irradiating the protective coating (3) with at least one of a laser beam or plasma; dividing the substrate (2) into the plurality of semiconductor device chips (1) by cutting off the substrate (2); and removing the protective coating (3) from either the substrate (2) or the semiconductor device chips (1) by bringing the protective coating (3) into contact with an aqueous cleaning fluid. The protective composition contains a water-soluble polyester resin (A) including a polyvalent carboxylic acid residue (a) and a polyvalent alcohol residue (b). The polyvalent carboxylic acid residue (a) includes: a polyvalent carboxylic acid residue (a1) having a metal sulfonate group; and a naphthalene dicarboxylic acid residue (a2). The proportion of the polyvalent carboxylic acid residue (a1) to the polyvalent carboxylic acid residue (a) falls within the range from 25 mol % to 70 mol %. The proportion of the naphthalene dicarboxylic acid residue (a2) to the polyvalent carboxylic acid residue (a) falls within the range from 30 mol % to 75 mol %.

According to the first aspect, using the protective composition allows the protective coating (3) to be formed easily, to protect the substrate (2) and the semiconductor device chips (1) from at least one of a laser beam or plasma, and to be removed easily from either the substrate (2) or the semiconductor device chips (1) using an aqueous cleaning fluid.

In a method for fabricating semiconductor device chips (1) according to a second aspect of the present disclosure, which may be implemented in conjunction with the first aspect, the polyvalent carboxylic acid residue (a) further includes at least one aliphatic dicarboxylic acid residue selected from the group consisting of a succinic acid residue, an adipic acid residue, a sebacic acid residue, a dodecane diacid residue, and a 1,4-cyclohexane dicarboxylic acid residue.

The second aspect imparts good durability to the water-soluble polyester resin (A) and facilitates decreasing the glass transition temperature of the water-soluble polyester resin (A).

In a method for fabricating semiconductor device chips (1) according to a third aspect of the present disclosure, which may be implemented in conjunction with the first or second aspect, the polyvalent alcohol residue (b) includes at least one glycol residue selected from the group consisting of an ethylene glycol residue, a diethylene glycol residue, a polyethylene glycol residue, a 1,4-butanediol residue, a 1,6-hexanediol residue, and a neopentyl glycol residue.

The third aspect imparts good durability to the water-soluble polyester resin (A) and facilitates decreasing the glass transition temperature of the water-soluble polyester resin (A).

In a method for fabricating semiconductor device chips (1) according to a fourth aspect of the present disclosure, which may be implemented in conjunction with any one of the first to third aspects, the water-soluble polyester resin (A) has an acid number of 10 mgKOH/g or less.

The fourth aspect reduces the chances of the water-soluble polyester resin (A) causing metal discoloration.

In a method for fabricating semiconductor device chips (1) according to a fifth aspect of the present disclosure, which may be implemented in conjunction with any one of the first to fourth aspects, the water-soluble polyester resin (A) has a glass transition temperature of 10° C. to 100° C.

According to the fifth aspect, the water-soluble polyester resin's (A) having a glass transition temperature of 10° C. or more reduces the chances of the protective coating (3) formed out of the water-soluble polyester resin (A) coming to have excessive adhesiveness, thus making it easier to handle the protective coating (3). In addition, the water-soluble polyester resin's (A) having a glass transition temperature of 100° C. or less allows a coating of the water-soluble polyester resin (A) to be formed more easily, thus increasing the degree of close contact between the protective coating (3) and the substrate (2) more easily.

A method for fabricating semiconductor device chips (1) according to a sixth aspect of the present disclosure, which may be implemented in conjunction with any one of the first to fifth aspects, includes removing, by laser ablation, the protective coating (3) at least partially from the substrate (2) by irradiating the protective coating (3) with the laser beam.

The sixth aspect reduces, even when a groove that exposes the substrate (2) is formed by laser ablation through the protective coating (3), the chances of causing a decline in the water solubility of the protective coating (3) and still allows the protective coating (3) to be removed easily with an aqueous cleaning fluid.

A method for fabricating semiconductor device chips (1) according to a seventh aspect of the present disclosure, which may be implemented in conjunction with any one of the first to sixth aspects, includes removing a portion of the protective coating (3) from the substrate (2) and then irradiating the protective coating (3) and a portion, exposed by removing the portion of the protective coating (3), of the substrate (2) with the plasma to remove the portion of the substrate (2) at least partially.

The seventh aspect allows even the protective coating (3) irradiated with the plasma to be easily removed with the aqueous cleaning fluid.

A method for fabricating semiconductor device chips (1) according to an eighth aspect of the present disclosure, which may be implemented in conjunction with any one of the first to seventh aspects, includes applying the protective composition onto the substrate (2) by either spray coating or spin coating.

The eighth aspect allows the protective composition to be applied onto the substrate (2) particularly easily.

In a method for fabricating semiconductor device chips (1) according to a ninth aspect of the present disclosure, which may be implemented in conjunction with any one of the first to eighth aspects, the protective composition has a viscosity of 0.5 mPa·s to 1000 mPa·s at room temperature.

The ninth aspect allows the protective composition to be applied onto the substrate (2) particularly easily.

A protective composition according to a tenth aspect of the present disclosure is used to fabricate semiconductor device chips (1) by dividing a substrate (2) into a plurality of semiconductor device chips (1). The method for fabricating semiconductor device chips (1) includes: forming a protective coating (3) that covers the substrate (2) by applying the protective composition onto the substrate (2); irradiating the protective coating (3) with at least one of a laser beam or plasma; dividing the substrate (2) into the plurality of semiconductor device chips (1) by cutting off the substrate (2); and removing the protective coating (3) from either the substrate (2) or the semiconductor device chips (1) by bringing the protective coating (3) into contact with an aqueous cleaning fluid. The protective composition contains a water-soluble polyester resin (A) including a polyvalent carboxylic acid residue (a) and a polyvalent alcohol residue (b). The polyvalent carboxylic acid residue (a) includes: a polyvalent carboxylic acid residue (a1) having a metal sulfonate group; and a naphthalene dicarboxylic acid residue (a2). The proportion of the polyvalent carboxylic acid residue (a1) to the polyvalent carboxylic acid residue (a) falls within the range from 25 mol % to 70 mol %. The proportion of the naphthalene dicarboxylic acid residue (a2) to the polyvalent carboxylic acid residue (a) falls within the range from 30 mol % to 75 mol %.

The tenth aspect allows semiconductor device chips (1) to be fabricated by irradiating a protective coating (3), which has been formed on a substrate (2), with at least one of a laser beam or plasma. In this case, using the protective composition allows the protective coating (3) to be formed easily, to protect the substrate (2) and the semiconductor device chips (1) from at least one of a laser beam or plasma, and to be removed easily from the semiconductor device chips (1) using an aqueous cleaning fluid. In addition, this also reduces the chances of causing a decline in the water solubility of the protective coating (3), thus increasing the manufacturing efficiency of the semiconductor device chips (1).

In a protective composition according to an eleventh aspect of the present disclosure, which may be implemented in conjunction with the tenth aspect, the polyvalent carboxylic acid residue (a) further includes at least one aliphatic dicarboxylic acid residue selected from the group consisting of a succinic acid residue, an adipic acid residue, a sebacic acid residue, a dodecane diacid residue, and 1,4-cyclohexane dicarboxylic acid residue.

The eleventh aspect imparts good durability to the water-soluble polyester resin (A) and facilitates decreasing the glass transition temperature of the water-soluble polyester resin (A).

In a protective composition according to a twelfth aspect of the present disclosure, which may be implemented in conjunction with the tenth or eleventh aspect, the polyvalent alcohol residue (b) includes at least one glycol residue selected from the group consisting of an ethylene glycol residue, a diethylene glycol residue, a polyethylene glycol residue, 1,4-butanediol residue, a 1,6-hexanediol residue, and a neopentyl glycol residue.

The twelfth aspect imparts good durability to the water-soluble polyester resin (A) and facilitates decreasing the glass transition temperature of the water-soluble polyester resin (A).

In a protective composition according to a thirteenth aspect of the present disclosure, which may be implemented in conjunction with any one of the tenth to twelfth aspects, the water-soluble polyester resin (A) has an acid number of 10 mgKOH/g or less.

The thirteenth aspect reduces the chances of the water-soluble polyester resin (A) causing metal discoloration.

In a protective composition according to a fourteenth aspect of the present disclosure, which may be implemented in conjunction with any one of the tenth to thirteenth aspects, the water-soluble polyester resin (A) has a glass transition temperature of 10° C. to 100° C.

According to the fourteenth aspect, the water-soluble polyester resin's (A) having a glass transition temperature of 10° C. or more reduces the chances of the protective coating (3) coming to have excessive adhesiveness, thus making it easier to handle the protective coating (3). In addition, the water-soluble polyester resin's (A) having a glass transition temperature of 100° C. or less allows a coating of the water-soluble polyester resin (A) to be formed more easily, thus increasing the degree of close contact between the protective coating (3) and the substrate (2) more easily.

The invention claimed is:

1. A method for fabricating semiconductor device chips by dividing a substrate into a plurality of semiconductor device chips, the method comprising:
    forming a protective coating that covers the substrate by applying a protective composition onto the substrate;
    irradiating the protective coating with at least one of a laser beam or plasma;
    dividing the substrate into the plurality of semiconductor device chips by cutting off the substrate; and
    removing the protective coating from either the substrate or the semiconductor device chips by bringing the protective coating into contact with an aqueous cleaning fluid,
    the protective composition containing a water-soluble polyester resin (A) including a polyvalent carboxylic acid residue (a) and a polyvalent alcohol residue (b),
    the polyvalent carboxylic acid residue (a) including: a first polyvalent carboxylic acid residue (a1) having a metal sulfonate group; and a second polyvalent carboxylic acid residue (a2) being a naphthalene dicarboxylic acid residue,
    a proportion of the first polyvalent carboxylic acid residue (a1) to the polyvalent carboxylic acid residue (a) falling within a range from 25 mol % to 70 mol %,
    a proportion of the second polyvalent carboxylic acid residue (a2) to the polyvalent carboxylic acid residue (a) falling within a range from 30 mol % to 75 mol %, and
    a total of the proportion of the first polyvalent carboxylic acid residue (a1) to the polyvalent carboxylic acid residue (a) and the proportion of the second polyvalent carboxylic acid residue (a2) to the polyvalent carboxylic acid residue (a) being equal to or less than 100 mol %.

2. The method of claim 1, wherein
    the polyvalent carboxylic acid residue (a) further includes at least one aliphatic dicarboxylic acid residue selected from the group consisting of a succinic acid residue, an adipic acid residue, a sebacic acid residue, a dodecane diacid residue, and a 1,4-cyclohexane dicarboxylic acid residue.

3. The method of claim 1, wherein
    the polyvalent alcohol residue (b) includes at least one glycol residue selected from the group consisting of an ethylene glycol residue, a diethylene glycol residue, a polyethylene glycol residue, a 1,4-butanediol residue, a 1,6-hexanediol residue, and a neopentyl glycol residue.

4. The method of claim 1, wherein
    the water-soluble polyester resin (A) has an acid number of 10 mgKOH/g or less.

5. The method of claim 1, wherein
    the water-soluble polyester resin (A) has a glass transition temperature of 10° C. to 100° C.

6. The method of claim 1, comprising removing, by laser ablation, the protective coating at least partially from the substrate by irradiating the protective coating with the laser beam.

7. The method of claim 1, comprising removing a portion of the protective coating from the substrate and then irradiating the protective coating and a portion, exposed by removing the portion of the protective coating, of the substrate with the plasma to remove the portion of the substrate at least partially.

8. The method of claim 1, comprising applying the protective composition onto the substrate by either spray coating or spin coating.

9. The method of claim 1, wherein
    the protective composition has a viscosity of 0.5 mPa s to 1000 mPa s at room temperature.

10. The method of claim 2, wherein
    the polyvalent alcohol residue (b) includes at least one glycol residue selected from the group consisting of an ethylene glycol residue, a diethylene glycol residue, a polyethylene glycol residue, a 1,4-butanediol residue, a 1,6-hexanediol residue, and a neopentyl glycol residue.

11. The method of claim 2, wherein
    the water-soluble polyester resin (A) has an acid number of 10 mgKOH/g or less.

12. The method of claim 3, wherein
    the water-soluble polyester resin (A) has an acid number of 10 mgKOH/g or less.

13. The method of claim 10, wherein
    the water-soluble polyester resin (A) has an acid number of 10 mgKOH/g or less.

14. The method of claim 2, wherein
    the water-soluble polyester resin (A) has a glass transition temperature of 10° C. to 100° C.

15. The method of claim 3, wherein
    the water-soluble polyester resin (A) has a glass transition temperature of 10° C. to 100° C.

16. A protective composition for use to fabricate semiconductor device chips by dividing a substrate into a plurality of semiconductor device chips,
    a method for fabricating the semiconductor device chips including:
    forming a protective coating that covers the substrate by applying the protective composition onto the substrate;
    irradiating the protective coating with at least one of a laser beam or plasma;
    dividing the substrate into the plurality of semiconductor device chips by cutting off the substrate; and
    removing the protective coating from either the substrate or the semiconductor device chips by bringing the protective coating into contact with an aqueous cleaning fluid,
    the protective composition containing a water-soluble polyester resin (A) including a polyvalent carboxylic acid residue (a) and a polyvalent alcohol residue (b),
    the polyvalent carboxylic acid residue (a) including: a first polyvalent carboxylic acid residue (a1) having a metal sulfonate group; and a second polyvalent carboxylic acid residue (a2) being a naphthalene dicarboxylic acid residue,
    a proportion of the first polyvalent carboxylic acid residue (a1) to the polyvalent carboxylic acid residue (a) falling within a range from 25 mol % to 70 mol %,
    a proportion of the second polyvalent carboxylic acid residue (a2) to the polyvalent carboxylic acid residue (a) falling within a range from 30 mol % to 75 mol %, and
    a total of the proportion of the first polyvalent carboxylic acid residue (a1) to the polyvalent carboxylic acid residue (a) and the proportion of the second polyvalent carboxylic acid residue (a2) to the polyvalent carboxylic acid residue (a) being equal to or less than 100 mol %.

17. The protective composition of claim 16, wherein
the polyvalent carboxylic acid residue (a) further includes
at least one aliphatic dicarboxylic acid residue selected
from the group consisting of a succinic acid residue, an
adipic acid residue, a sebacic acid residue, a dodecane
diacid residue, and 1,4-cyclohexane dicarboxylic acid
residue.

18. The protective composition of claim 16, wherein
the polyvalent alcohol residue (b) includes at least one
glycol residue selected from the group consisting of an
ethylene glycol residue, a diethylene glycol residue, a
polyethylene glycol residue, 1,4-butanediol residue, a
1,6-hexanediol residue, and a neopentyl glycol residue.

19. The protective composition of claim 16, wherein
the water-soluble polyester resin (A) has an acid number
of 10 mgKOH/g or less.

20. The protective composition of claim 16, wherein
the water-soluble polyester resin (A) has a glass transition
temperature of 10° C. to 100° C.

* * * * *